US012598935B2

(12) United States Patent
Zhou et al.

(10) Patent No.: US 12,598,935 B2
(45) Date of Patent: Apr. 7, 2026

(54) COMPOSITION AND METHOD FOR CONDUCTING A MATERIAL REMOVING OPERATION

(71) Applicant: SAINT-GOBAIN CERAMICS & PLASTICS, INC., Worcester, MA (US)

(72) Inventors: Renjie Zhou, Alhambra, CA (US); Lin Fu, Rancho Palos Verdes, CA (US); Chun-Lung Kuan, Anaheim, CA (US)

(73) Assignee: SAINT-GOBAIN CERAMICS & PLASTICS, INC., Worcester, MA (US)

( * ) Notice: Subject to any disclaimer, the term of this patent is extended or adjusted under 35 U.S.C. 154(b) by 230 days.

(21) Appl. No.: 18/360,042

(22) Filed: Jul. 27, 2023

(65) Prior Publication Data

US 2024/0038543 A1 Feb. 1, 2024

Related U.S. Application Data

(60) Provisional application No. 63/369,851, filed on Jul. 29, 2022.

(51) Int. Cl.
*H10P 52/40* (2026.01)
*C09G 1/02* (2006.01)
*C09K 3/14* (2006.01)

(52) U.S. Cl.
CPC .............. *H10P 52/403* (2026.01); *C09G 1/02* (2013.01); *C09K 3/1409* (2013.01)

(58) Field of Classification Search
None
See application file for complete search history.

(56) References Cited

U.S. PATENT DOCUMENTS 6,709,316 B1 * 3/2004 Sun .......................... C09G 1/02
438/692
6,866,792 B2 3/2005 Small
(Continued)

FOREIGN PATENT DOCUMENTS

JP 2005518090 A 6/2005
JP 2015522669 A 8/2015
(Continued)

OTHER PUBLICATIONS

International Search Report with regard to International Application No. PCT/US2023/071077, dated Nov. 7, 2023, pp. 1-10.

*Primary Examiner* — Stephanie P Duclair
(74) *Attorney, Agent, or Firm* — Abel Schillinger, LLP; Adrian Lawrence

(57) ABSTRACT

In one embodiment, a polishing composition can comprise abrasive particles including zirconia, an oxidizing agent including hydroxylamine and water. The polishing composition can have a high copper removal rate of at least 3500 Å/min, and a polishing selectivity of copper to silicon dioxide(Cu:SiO$_2$) can be at least 2.5:1. In another embodiment, a combination product can comprise a first polishing composition and a second polishing composition, wherein each of the first polishing composition and the second polishing composition can comprise abrasive particles including zirconia and an oxidizing agent including hydroxylamine, wherein a hydroxylamine weight % ratio of the first polishing composition to the second polishing composition may be at least 5:1.

19 Claims, 1 Drawing Sheet

(56)                    References Cited

U.S. PATENT DOCUMENTS

| | | | |
|---|---|---|---|
| 7,014,669 B2 * | 3/2006 | Small | C23F 3/04 |
| | | | 106/3 |
| 7,104,869 B2 | 9/2006 | Tsai | |
| 7,427,305 B2 | 9/2008 | Scott | |
| 7,998,335 B2 | 8/2011 | Feeney | |
| 8,088,690 B2 | 1/2012 | Mcdevitt | |
| 8,470,195 B2 | 6/2013 | Kunitani | |
| 8,778,212 B2 | 7/2014 | Jin | |
| 2004/0229461 A1 * | 11/2004 | Darsillo | C23F 3/06 |
| | | | 438/689 |
| 2009/0130849 A1 * | 5/2009 | Lee | H01L 21/02063 |
| | | | 438/693 |
| 2013/0161285 A1 | 6/2013 | Li | |
| 2017/0066944 A1 | 3/2017 | Cui | |

FOREIGN PATENT DOCUMENTS

| | | | |
|---|---|---|---|
| WO | 2011101755 A1 | 8/2011 | |
| WO | 2018183310 A1 | 10/2018 | |
| WO | 2021041694 A1 | 3/2021 | |

* cited by examiner

FIG. 1A                    FIG. 1B

COMPOSITION AND METHOD FOR CONDUCTING A MATERIAL REMOVING OPERATION

CROSS-REFERENCE TO RELATED APPLICATION(S)

This application claims priority under 35 U.S.C. § 119(e) to U.S. Patent Application No. 63/369,851, entitled "COMPOSITION AND METHOD FOR CONDUCTING A MATERIAL REMOVING OPERATION," by Renjie ZHOU et al., filed Jul. 29, 2022, which is assigned to the current assignee hereof and incorporated herein by reference in its entirety.

FIELD OF THE DISCLOSURE

The present disclosure relates to a composition for conducting a material removal operation, specifically an aqueous polishing composition comprising abrasive particles including zirconia and an oxidizing agent including hydroxylamine.

BACKGROUND

Abrasive slurries have a large variety of applications, for example, for polishing of glass, ceramic, or metal materials, and are often designed for conducting a chemical mechanical planarization (CMP) process. In a typical CMP process, the relative movement of the slurry to a substrate to be polished assists with the planarization (polishing) process by chemically and mechanically interacting with the exterior surface of the substrate and removing unwanted material. Polishing is conducted until a desired smooth exterior surface with a low surface roughness is obtained. There exists a need of developing cost-efficient abrasive slurries having a high material removal rate and leading to polished substrates having a low surface roughness.

BRIEF DESCRIPTION OF THE DRAWINGS

The present disclosure may be better understood, and its numerous features and advantages made apparent to those skilled in the art by referencing the accompanying drawings.

FIG. 1A includes a line drawing illustrating a patterned wafer before conducting the polishing method of the present disclosure.

FIG. 1B includes a line drawing illustrating a patterned wafer before conducting the polishing method of the present disclosure.

DETAILED DESCRIPTION

Figure 1C:
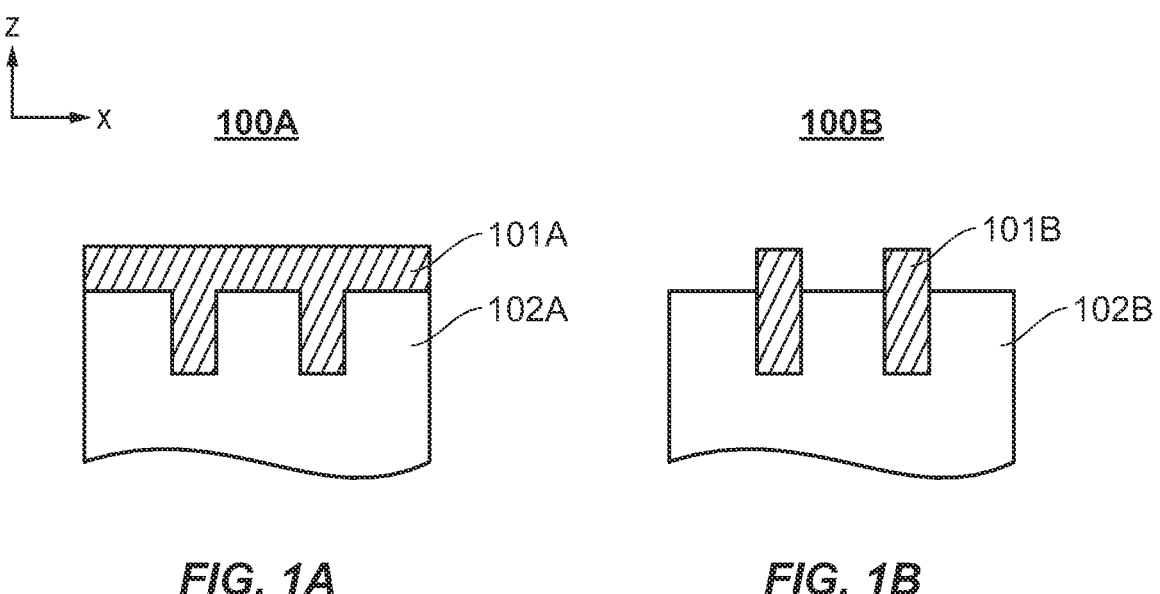
FIG. 1C includes a line drawing illustrating the patterned wafer shown in FIG. 1A or 1B after conducting the polishing method according to embodiments.
Figure 1C:
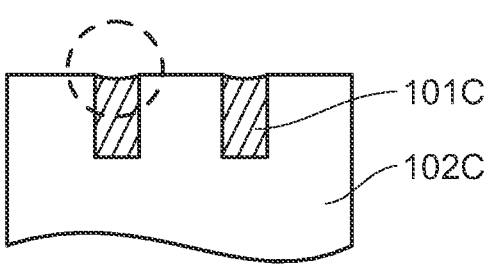

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus.

As used herein, and unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

In one embodiment, the present disclosure is directed to a polishing composition comprising abrasive particles including zirconia, an oxidizing agent including hydroxylamine, and water. The polishing composition may have a polishing selectivity of copper to silicon dioxide ($Cu:SiO_2$) of at least 2.5:1.

In a certain aspect, the selectivity of copper to silicon dioxide can be at least 3:1, or at least 3.5:1, or at least 4:1.

In another embodiment, the polishing composition of the present disclosure can be adapted to polish a copper-containing material with an average material removal rate (MMR) of at least 3500 Å/min, or at least 3800 Å/min, or at least 4000 Å/min, or at least 4200 Å/min according to a Copper Polishing Test as described herein. In a further embodiment, the average material removal rate may be not greater than 15,000 Å/min or not greater than 10,000 Å/min according to the Copper Polishing Test. The polishing composition may have an average material removal rate within a range including any of the minimum and maximum values note above.

In one aspect, the abrasive particles including zirconia can comprise at least 80 wt % zirconia, or at least 85 wt % zirconia, or at least 90 wt % zirconia, or at least 95 wt % zirconia, or at least 97 wt % zirconia, or at least 98 wt % zirconia, or at least 99 wt % zirconia, or at least 99.5 wt % zirconia.

In one particular aspect, the abrasive particles can consist essentially of zirconia. Consisting essentially of zirconia means herein that the material of the abrasive particles includes at least 99.5 wt % zirconia.

In another particular aspect, the abrasive particles including zirconia can comprise zirconia particles including a Cl-containing species. In a certain aspect, the Cl-containing species can be inorganic and include chloride ($Cl^-$). The amount of the chloride ($Cl^-$) can be at least 1 ppm or at least 50 ppm or at least 100 ppm, or at least 200 ppm, and not greater than 3000 ppm, or not greater than 2000 ppm, or not greater than 1000 ppm, or not greater than 500 ppm.

As used herein, the phrase "abrasive particles including zirconia" is interchangeable used with the phrase "zirconia particles," if not indicated otherwise.

The average particle size (D50) of the zirconia particles can be at least 30 nm, or at least nm, or at least 60 nm, or at least 80 nm, or at least 100 nm, or at least 130 nm, or at least 150 nm, or at least 200 nm. In another aspect, the zirconia particles can have a D50 size of not greater than 500 nm, or not greater than 400 nm, or not greater than 300 nm, or not greater than 200 nm, or not greater than 150 nm, of not greater than 100 nm. The D50 size of the zirconia particles can be a value within a range between any of the minimum and maximum values noted above.

The amount of the zirconia particles can be at least 1 wt % based on the total weight of the polishing composition, or at least 1.5 wt %, or at least 2 wt %, or at least 3 wt %, or at least 5 wt %. In another aspect, the amount of the abrasive particles including zirconia particles can be not greater than 10 wt %, or not greater than 8 wt %, or not greater than 6 wt %, or not greater than 5 wt %, or not greater than 4 wt %. The amount of abrasive particles including zirconia can be a value within a range between any of the minimum and maximum values noted above.

In a further embodiment, the amount of hydroxylamine of the polishing composition can be at least 0.1 wt % based on the total weight of the polishing composition, or at least 0.5 wt %, or at least 1.0 wt %, or at least 1.3 wt %, or at least 1.5 wt %, or at least 2 wt %, or at least 3 wt %, or at least 4 wt %, or at least 5 wt %. In another embodiment, the amount of hydroxylamine may be not greater than 10 wt % based on the total weight of the polishing composition, or not greater than 8 wt %, or not greater than 5 wt %, or not greater than 3 wt %, or not greater than 2 wt %. The amount of hydroxylamine can be a value within a range between any of the minimum and maximum values noted above.

In a particular embodiment, the oxidizing agent can consist essentially of hydroxylamine. As used herein, the oxidizing agent consisting essentially of hydroxylamine means that at least 99 wt % based on the total weight of the oxidizing agent are hydroxylamine.

In one particular embodiment, the polishing composition of the present disclose can comprise hydroxylamine in an amount of 0.5 wt % to 3.0 wt %, zirconia particles in an amount of 3 wt % to 8 wt %, and water in an amount of at least 90 wt %.

In another particular embodiment, the oxidizing agent may include next to hydroxylamine one or more other oxidizing agents. Non-limiting examples of other oxidizing agents can be, for example, bromates, chlorates, iodates, iron (III) salts (e.g., nitrates, sulfates), cerium (IV) salts, a permanganate salt (such as, potassium permanganate), potassium persulfate, or iodic acid.

The pH of the polishing composition can be at least 2.5, or at least at least 3.0, at least 3.5, at least 4.0, at least 4.5, at least 5.0, or at least 5.5. In another aspect, the pH may be not greater than 11.0, or not greater than 9.0, or not greater than 8.0, or not greater than 7.0, or not greater than 6.5, or not greater than 6, or not greater than 5.8, or not greater than 5.5, or not greater than 5.0. In a particular aspect, the pH can be in a range between 3.0 and 5.8.

In aspects, the polishing composition can include an optional additive, for example, a surfactant, a corrosion protecting agent. Non-limiting examples of corrosion protecting agents can be a triazole, benzimidazole, benzothiazole, and derivatives thereof, such as, for example, hydroxy-, amino-, imino-, carboxy-, mercapto-, nitro-, urea-, thiourea-, or alkyl-substituted derivatives thereof. Most preferably, the at least one heterocyclic compound can be benzotriazole.

In a particular aspect, the polishing composition of the present disclosure can be essentially free of an aminosilane compound. As used herein, essentially free of an aminosilane compound means that the polishing composition contains less than 0.01 wt % based on the total weight of the polishing composition an aminosilane compound.

In yet another aspect, the polishing composition of the present disclosure can be essentially free of an organic phosphonic acid. As used herein, essentially free of an organic phosphonic acid means that the polishing composition contains less than 0.001 wt % based on the total weight of the polishing composition of an organic phosphonic acid.

In another embodiment, the polishing composition may be essentially free of glycine. As used herein, essentially free of glycine means that the polishing composition contains less than wt % based on the total weight of the polishing composition glycine.

In a further embodiment, the polishing composition of the present disclosure can also have a high polishing selectivity to copper in comparison to silicon nitride. In one embodiment, the polishing selectivity of copper to silicon nitride (Cu:SiN) can be at least 2.5:1, or at least 3:1, or at least 3.5:1, or at least 4:1.

In a further aspect, the polishing selectivity to copper to silicon nitride to silicon dioxide (Cu:SiN:SiO$_2$) of the polishing composition can range from 2.5:1:1 to 5:1:1, or from 3:1:1 to 4.5:1:1.

In one embodiment, the present disclosure is directed to a method of polishing a substrate using the polishing composition described above. The method can have the surprising advantage that a copper-containing substrate can be polished with a high copper removal rate. In one aspect, polishing of the substrate may be adapted that a copper material removal rate during polishing (MMR) of the substrate can be at least 3500 Å/min, or at least 3800 Å/min, or at least 4000 Å/min, or at least 4200 Å/min.

The polishing method can comprise: providing the polishing composition of the present disclosure described above, bringing the polishing composition in direct contact with the substrate; and polishing the substrate surface. In one aspect, the substrate can be polished with a polishing pad, wherein the polishing pad and the substrate are moving relative to one another and the polishing composition is in contact with the substrate and the polishing pad.

In one embodiment, the temperature of the polishing composition during polishing can be at least 22° C., or at least 25° C., or at least 30° C., or at least 40° C., or at least 45° C., or at least 50° C., or at least 55° C., or at least 60° C., or at least 65° C. In another embodiment, the temperature of the composition during polishing may be not greater than 90° C., or not greater than 85° C., or not greater than 80° C., or not greater than 75° C., or not greater than 70° C. The temperature of the composition during polishing can be a value in a range between any of the minimum and maximum values noted above. In a particular embodiment, the polishing temperature can be between 22° C. and 25° C.

The present disclosure is further directed to a combination product comprising a first polishing composition and a second polishing composition, wherein both the first polishing composition and the second polishing composition can comprise abrasive particles including zirconia and an oxidizing agent including hydroxylamine, and wherein a hydroxylamine weight % ratio of the first polishing composition to the second polishing composition can be at least 5:1. In certain aspects, the weight % ratio of hydroxylamine of the first polishing composition to the second polishing composition can be at least 8:1 or at least 10:1.

In one aspect, the amount of the hydroxylamine of the first polishing composition can be in a range of at least 0.8 wt % to not greater than 20 wt % based on the total weight of the first polishing composition; and the amount of the hydroxylamine of the second polishing composition can be in a range of at least 0.05 wt % and not greater than 5 wt %.

In a certain aspect, the first polishing composition of the combination product can be the polishing composition of the present disclosure described above with the high polishing selectivity to copper, while the second polishing composition can be adapted that it may have a higher polishing selectivity to silicon nitride (SiN) in comparison the copper (Cu).

In one embodiment, the first polishing composition can have a polishing selectivity of copper to silicon nitride (Cu:SiN) of at least 2.5:1, or at least 3:1, or at least 3.5:1, or at least 4:1, and the second polishing composition may have a polishing selectivity of copper to silicon nitride (Cu:SiN) of not greater than 1:15, or not greater than 1:20, or not greater than 1:25, or not greater than 1:30.

In one aspect of the combination product, the second polishing composition can comprise the same amount and type of abrasive particles including zirconia as the first polishing composition.

In another aspect, the average particle size (D50) ratio ZP1:ZP2 of the zirconia particles of the first polishing composition (ZP1) to the zirconia particles of the second polishing composition (ZP2) can be nor greater than 1:1.1, or not greater than 1:1.3, or not greater than 1:1.5, or not greater than 1:1.7, or not greater than 1:1.8.

In one embodiment, the first polishing composition of the combination product can be adapted for adding water to reach a two-fold to ten-fold increase in volume based on the original volume of the first polishing composition.

In another embodiment of the combination product, the second polishing composition can be adapted for adding water to reach a two-fold to ten-fold increase in volume based on an original volume of the second polishing composition.

In one aspect, both the first polishing composition and the second polishing composition may be diluted with water before using the compositions during a polishing process, in another aspect, only the first polishing composition or only the second polishing composition can be diluted with water before use.

The combination product of the present disclosure can be used for polishing a substrate. In one embodiment, the method of polishing a substrate of the present disclosure can have the following order: polishing the substrate with the first polishing composition, the first polishing composition comprising abrasive particles including zirconia, an oxidizing agent including hydroxylamine and water, wherein an amount of the hydroxylamine is at least 1.0 wt % based on the total weight of the first polishing composition; and polishing the substrate with the second polishing composition, the second polishing composition comprising abrasive particles including zirconia, an oxidizing agent including hydroxylamine and water, wherein an amount of the hydroxylamine is at least 0.05 wt % and not greater than 0.5 wt % based on the total weight of the second polishing composition.

In a certain aspect, the substrate used in the polishing method can be a patterned wafer.

In one embodiment, the patterned wafer can be a copper TSV (through-silicon-via) wafer.

In one aspect, as illustrated in FIG. 1A, the patterned wafer (100A) can include a copper layer (101A) and a dielectric layer (102A), wherein the copper layer can include vertical pillar sections extending through a thickness direction (z) of the dielectric layer. In another aspect, as shown in FIG. 1B, the patterned wafer (100B) can include isolated copper pillars (101B), which extend vertically (z-direction) through the dielectric layer (102B) of the wafer.

The dielectric layer of the patterned wafer can be a single layer or a combination of two or more dielectric layers. In a certain aspect, the dielectric layer can include a silicon dioxide layer and a silicon nitride layer. FIG. 1C illustrates the patterned wafer after the polishing, wherein the copper pillars (101C) are about level with the outer surface of the dielectric layer (102C).

Figure 1D:
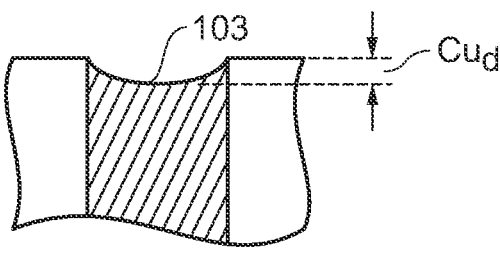
FIG. 1D includes a line drawing magnifying a section of the patterned wafer shown in FIG. 1C to illustrate the copper dishing value according to one embodiment.

It has been surprisingly found that patterned wafers as described in FIGS. 1A and 1B can be polished according to the two-step polishing process using the combination product of the present disclosure with a high efficiency. Using the combination product of the present disclosure can have the advantage that copper dishing may be very minor. As used herein, "copper dishing" means the forming of a dent or intrusion (103) after removing the protruding sections of the copper layer/pillars by the polishing process, see FIG. 1C and FIG. 1D. The "copper dishing" can be quantified by the copper dishing value $Cu_d$, which is the maximum depth measured of the dent (103) in orthogonal direction (z-direction) from the plane (x-direction) of the wafer. In a certain aspect, the copper dishing value $Cu_d$ may be not greater than 200 Å, or not greater than 150 Å, or not greater than 100 Å, or not greater than 80 Å, or not greater than 60 Å.

As further demonstrated in the Examples below, the present disclosure provides compositions suitable as abrasive slurries for polishing a substrate, and particularly for chemical mechanical polishing a substrate.

Many different aspects and embodiments are possible. Some of those aspects and embodiments are described herein. After reading this specification, skilled artisans will appreciate that those aspects and embodiments are only illustrative and do not limit the scope of the present invention. Embodiments may be in accordance with any one or more of the embodiments as listed below.

EMBODIMENTS

Embodiment 1. A polishing composition comprising abrasive particles including zirconia, an oxidizing agent including hydroxylamine and water, wherein a polishing selectivity of copper to silicon dioxide (Cu:SiO2) of the polishing composition is at least 2.5:1.

Embodiment 2. A polishing composition comprising abrasive particles including zirconia, an oxidizing agent including hydroxylamine and water, wherein the polishing composition is designed of polishing a copper substrate with an average material removal rate (MMR) of at least 3500 Å/min according to a copper polishing test.

Embodiment 3. A polishing composition comprising abrasive particles including zirconia, an oxidizing agent including hydroxylamine and water, wherein the polishing composition comprises a stability factor (SF) of at least 7.

Embodiment 4. The polishing composition of Embodiment 3, wherein the polishing composition comprises a stability factor (SF) of at least 10, or at least 15, or at least 20, or at least 30.

Embodiment 5. The polishing composition of Embodiment 2, wherein the polishing selectivity of Cu:SiO2 is at least 3:1, or at least 3.5:1, or at least 4:1.

Embodiment 6. The polishing composition of Embodiments 1 or 2, wherein a material of the abrasive particles includes at least 80 wt % zirconia, or at least 85 wt % zirconia, or at least 90 wt % zirconia, or at least 95 wt % zirconia, or at least 98 wt % zirconia, or at least 99 wt % zirconia, or at least 99.5 wt % zirconia.

Embodiment 7. The polishing composition of any one of the preceding Embodiments, wherein an average (D50) particle size of the abrasive particles is at least 30 nm, or at least 50 nm, or at least 60 nm, or at least 80 nm, or at least 100 nm, or at least 130 nm, or at least 150 nm, or at least 200 nm.

Embodiment 8. The polishing composition of any one of the preceding Embodiments, wherein an average (D50) particle size of the abrasive particles is not greater than 500 nm, or not greater than 400 nm, or not greater than 300 nm, or not greater than 200 nm, or not greater than 150 nm, of not greater than 100 nm.

Embodiment 9. The polishing composition of any one of the preceding Embodiments, wherein an amount of the hydroxylamine is at least 0.1 wt % based on the total weight of the polishing composition, or at least 0.5 wt %, or at least 1.0 wt %, or at least 1.3 wt %, or at least 1.5 wt %, or at least 2 wt %, or at least 3 wt %, or at least 5 wt %.

Embodiment 10. The polishing composition of any one of the preceding Embodiments, wherein an amount of the hydroxylamine is not greater than 10 wt % based on the total weight of the polishing composition, or not greater than 8 wt %, or not greater than 5 wt %, or not greater than 3 wt %, or not greater than 2 wt %.

Embodiment 11. The polishing composition of any one of the preceding Embodiments, wherein an amount of the abrasive particles is at least 1 wt % based on the total weight of the polishing composition, or at least 1.5 wt %, or at least 2 wt %, or at least 3 wt %, or at least 5 wt %.

Embodiment 12. The polishing composition of any one of the preceding Embodiments, wherein an amount of the abrasive particles is not greater than 10 wt %, or not greater than 8 wt %, or not greater than 6 wt %, or not greater than 5 wt %.

Embodiment 13. The polishing composition of any one of the preceding Embodiments, wherein a copper to silicon nitride (Cu:SiN) selectivity of the polishing composition is at least 2.5:1, or at least 3:1, or at least 3.5:1, or at least 4:1.

Embodiment 14. The polishing composition of any one of the preceding Embodiments, wherein a copper to silicon nitride to silicon dioxide (Cu:SiN:SiO2) selectivity of the polishing composition ranges from 2.5:1:1 to 5:1:1, or from 3:1:1 to 4.5:1:1.

Embodiment 15. The polishing composition of Embodiment 2, wherein the polishing composition is designed to polish the copper substrate with an average material removal rate (MMR) of at least 3800 Å/min, or at least 4000 Å/min, or at least 4200 Å/min according to the Copper Polishing Test.

Embodiment 16. The polishing composition of Embodiment 1, wherein the polishing composition is adapted to polish a silicon dioxide-containing material with an average material removal rate (MMR) of at least 800 Å/min, or at least 1000 Å/min, or at least 1500 Å/min, or at least 2000 Å/min according to a Silicone Dioxide Polishing Test.

Embodiment 17. The polishing composition of any one of the preceding Embodiments, wherein the oxidizing agent consists essentially of hydroxylamine.

Embodiment 18. The polishing composition of any of the preceding Embodiments, wherein a pH of the polishing composition is at least 2.5, or at last 3.0, at least 3.5, at least 4.0, at least 4.5, at least 5.0, or at least 5.5.

Embodiment 19. The polishing composition of any one of the preceding Embodiments, wherein a pH of the polishing composition is not greater than 11, or not greater than 9, or not greater than 7, or not greater than 6.5, or not greater than 6, or not greater than 5.5, or not greater than 5.

Embodiment 20. The polishing composition of Embodiments 18 or 19, wherein the pH is in a range between 3 and 5.8.

Embodiment 21. The polishing composition of any one of the preceding Embodiments, wherein the polishing composition is essentially free of an aminosilane compound.

Embodiment 22. The polishing composition of any one of the preceding Embodiments, wherein the polishing composition is essentially free of a phosphonic acid.

Embodiment 23. The polishing composition of any one of the preceding Embodiments, wherein the oxidizing agent includes hydroxylamine and at least one further oxidizing agent.

Embodiment 24. The polishing composition of Embodiment 23, wherein the at least one further oxidizing agent is selected from potassium persulfate, ammonium persulfate, periodic acid, a permanganate salt, Ce(IV) nitrate), or any combination thereof.

Embodiment 25. The polishing composition of any one of Embodiments 1 to 24, wherein the oxidizing agent consists essentially of hydroxylamine.

Embodiment 26. The polishing composition of any one of the preceding Embodiments, wherein the polishing composition comprises hydroxylamine in an amount of 0.5 wt % to 3.0 wt %, zirconia particles in an amount of 3 wt % to 8 wt %, and water in an amount of at least 90 wt % based on the total weight of the polishing composition.

Embodiment 27. The polishing composition of any one of the preceding Embodiments, wherein the abrasive particles including zirconia comprise a Cl-containing species in an amount of at least 1 ppm and not greater than 3000 ppm.

Embodiment 28. A combination product comprising a first polishing composition and a second polishing composition, wherein the first polishing composition comprises abrasive particles including zirconia and an oxidizing agent including hydroxylamine; the second polishing composition comprises abrasive particles including zirconia and an oxidizing agent including hydroxylamine; and a hydroxylamine weight % ratio of the first polishing composition to the second polishing composition is at least 5:1, or at least 8:1, or at least 10:1.

Embodiment 29. The combination product of Embodiment 28, wherein an amount of the hydroxylamine of the first polishing composition is at least 1.0 wt % and not greater than 20 wt % based on the total weight of the first polishing composition; and an amount of the hydroxylamine of the second polishing composition is at least 0.05 wt % and not greater than 0.8 wt %.

Embodiment 30. The combination product of any one of Embodiments 28 or 29, wherein the first polishing composition is the polishing composition of any one of Embodiments 1-27.

Embodiment 31. The combination product of any one of Embodiments 28-30, wherein the first polishing composition and the second polishing composition include a same amount of zirconia particles.

Embodiment 32. The combination product of any one of Embodiments 28-31, wherein an average particles size (D50) ratio ZP1:ZP2 of the zirconia particles of the first polishing composition (ZP1) to the zirconia particles of the second polishing composition (ZP2) can be nor greater than 1:1.1, or not greater than 1:1.3, or not greater than 1:1.5, or not greater than 1:1.7, or not greater than 1:1.8.

Embodiment 33. The combination product of any one of Embodiments 28-32, wherein the first polishing composition has a polishing selectivity of copper to silicon nitride (Cu:SiN) of at least 2.5:1, or at least 3:1, or at least 3.5:1, or at least 4:1, and the second polishing composition has a polishing selectivity of Cu:SiN of not greater than 1:15, or not greater than 1:20, or not greater than 1:25, or not greater than 1:30.

Embodiment 34. A method of polishing a substrate, comprising in a following order: polishing the substrate with a first polishing composition, the first polishing composition comprising abrasive particles including zirconia, an oxidizing agent including hydroxylamine and water, wherein an amount of the hydroxylamine is at least 1.0 wt % based on the total weight of the first polishing composition; and polishing the substrate with a second polishing composition, the second polishing composition comprising abrasive particles including zirconia, an oxidizing agent including hydroxylamine and water, wherein an amount of the hydroxylamine is at least 0.05 wt % and not greater than 0.8 wt % based on the total weight of the second polishing composition.

Embodiment 35. The method of Embodiment 34, wherein the substrate is a patterned wafer.

Embodiment 36. The method of Embodiment 35, wherein the patterned wafer comprises copper pillars, a silicon nitride layer, and a silicon dioxide layer.

Embodiment 37. The method of any one of Embodiments 34-36, wherein polishing the substrate is adapted that a copper material removal rate (MMR) during polishing the substrate with the first polishing composition is at least 3500 Å/min, or at least 3800 Å/min, or at least 4000 Å/min, or at least 4200 Å/min.

Embodiment 38. The method of any one of Embodiments 34-37, wherein the first polishing composition has a polishing selectivity of copper to silicon nitride (Cu:SiN) of at least 2.5:1, or at least 3:1, or at least 3.5:1, or at least 4:1, and the second polishing composition has a polishing selectivity of Cu:SiN of not greater than 1:15, or not greater than 1:20, or not greater than 1:25, or not greater than 1:30.

Embodiment 39. The method of any one of Embodiments 34-38, wherein the substrate is a patterned wafer including copper pillars, and a copper dishing value Cud after polishing the substrate with the first polishing composition and the second polishing composition may be not greater than 200 Å, or not greater than 150 Å, or not greater than 100 Å, or not greater than 80 A, or not greater than 60 Å.

EXAMPLES

The following non-limiting examples illustrate the present invention.

Example 1

Polishing Composition

A first polishing composition (S1-1) was prepared by combining in deionized water 5 wt % zirconia particles having an average particle size of 100 nm, 1.5 wt % hydroxylamine, and wt % benzotriazole. The pH was adjusted with KOH solution to a pH of 5.50.

Furthermore, comparative compositions were prepared which further included 0.03 wt % 3-aminopropyl trimethoxysilane (C1), 0.01 wt % (aminomethyl)phosphonic acid (C2), and both wt % (3-aminopropyl)trimethoxysilane and 0.01 wt % (aminomethyl)phosphonic acid (C3). Compositions C1, C2, and C3 further contained 0.5 wt % glycine. A summary of the polishing compositions is shown in Table 1 below.

TABLE 1

| | S1-1 | C1 | C2 | C3 |
|---|---|---|---|---|
| Zirconia (100 nm) | 5 | 5 | 5 | 5 |
| Hydroxylamine | 1.5 | 1.5 | 1.5 | 1.5 |
| Benzotriazole | 0.01 | 0.01 | 0.01 | 0.01 |
| (3-aminopropyl) trimethoxysilane | | 0.03 | | 0.03 |
| (aminomethyl)phosphonic acid | | | 0.01 | 0.01 |

TABLE 1-continued

| | S1-1 | C1 | C2 | C3 |
|---|---|---|---|---|
| Glycine | | 0.5 | 0.5 | 0.5 |
| DI Water | Balance | Balance | Balance | Balance |

Polishing Tests

Polishing tests were conducted to evaluate the polishing efficiency of the compositions summarized in Table 1.

The polishing tests evaluated a) the copper removal rate, b) the silicon nitride (SiN) removal rate and c) the silicon dioxide (SiO2) removal rate.

An exact description of the conducted polishing tests is provided below. A summary of the polishing results is shown in Table 2.

TABLE 2

| Composition | Copper Removal Rate [Å/min] | $SiO_2$ Removal Rate [Å/min] | SiN Removal Rate [Å/min] | Selectivity $Cu/SiN/SiO_2$ |
|---|---|---|---|---|
| S1-1 | 4231 | 1040 | 1415 | 4.0/1.3/1.0 |
| C1 | 2372 | 1128 | 1330 | 2.0/1.1/1.0 |
| C2 | 2775 | 1642 | 1491 | 2.0/1.1/1.2 |
| C3 | 3230 | 2607 | 1604 | 2.0/1.0/1.0 |

It was surprisingly observed that composition S1-1 had a much higher copper removal rate and sensitivity for copper in comparison to silicon nitride and silicon dioxide than polishing compositions C1, C2, and C3.

Testing the Copper Removal Rate/Silicon Nitride Removal Rate/and Silicon Dioxide Removal Rate As used herein, the following description of measuring the copper removal rate, the silicon nitride removal rate and the silicon dioxide removal rate also define the conditions of the "the copper polishing test," "the silicon nitride polishing test," and "the silicon dioxide polishing test."

All polishing experiments were conducted using as polishing tool an IPEC 472 machine, from IPEC/Westech Systems Inc. The polishing pad was a poromeric, polyurethane Politex Reg II from DuPont.

As polishing substrate for the copper polishing test was used a wafer having a diameter of 150 mm and an upper copper film with a thickness of 1.5 microns and a 0.7 mm base Si layer underneath the copper film (Lot # GM080520-2 from Advantive Technologies).

For measuring the silicon nitride removal rate, a wafer having a diameter of 150 mm and an upper silicon nitride (SiN) layer with a thickness of 2.0 μm was used with a 0.7 mm Si base underneath the SiN layer (Lot # GM051721-2 from Advantive Technologies).

Furthermore, for measuring the silicon dioxide removal rate, a TEOS wafer from Advantive Technologies was used (Lot # GM112921-3) having a diameter of 150 mm and a 2.0 μm thick silicon dioxide film on the upper side, and a 0.7 mm Si layer underneath the Silicon dioxide film.

The process parameters for conducting the polishing experiments were the same for measuring the copper removal rate, the silicon nitride removal rate, and the silicon dioxide removal rate, and are summarized in Table 3.

TABLE 3

| Parameter | Type/Value |
|---|---|
| Polishing Tool | IPEC 472 |
| Pad | Politex Reg II |
| Platen diameter (inches) | 22.5 |
| Run time [min] | 1 |
| Downforce [psi] | 2.5 |
| Platen Speed [rpm] | 120 |
| Carrier Speed [rpm] | 114 |
| Flow rate [ml/min] | 150 |
| flow rate/platen area | 0.38 ml/in$^2$ min |

The pad temperature during the polishing process was maintained between 22-25° C. After processing, the wafers were cleaned using cleanroom wipes and deionized water and then dried using compressed air.

The material removal rate (MRR) was determined by the change in weight of the wafer before and after polishing. The change in weight of the wafer before and after was divided by the time spent polishing (i.e., 1 minute) to calculate the average material removal rate per minute. The weight of the wafers was measured using a benchtop scale.

Example 2

Two polishing compositions (S2 and S3) were prepared the same way as composition S1 in Example 1, except that 0.5 wt % glycine was further included in sample S3, while sample S2 was the same as sample S1. The testing of the polishing efficiency with regard to a) the copper removal rate, b) the silicon nitride (SiN) removal rate and c) the silicon dioxide (SiO2) removal rate was also conducted as described in Example 1.

As shown in Table 4, both compositions S2 and S3 had a high copper removal rate, while the removal rate with regard to SiN and SiO2 was much lower, similar as the results in Example 1 for sample S1. It can be further seen that the copper removal rate was a bit lower if glycine was added (sample S3), but sample S3 had a higher selectivity for copper vs. SiN and SiO2 (5.66/0.94/1.0) than sample S2 (4.58/1.05/1.0).

TABLE 4

| Composition | Copper Removal Rate [Å/min] | SiO$_2$ Removal Rate [Å/min] | SiN Removal Rate [Å/min] | Selectivity Cu/SiN/SiO$_2$ |
|---|---|---|---|---|
| S2 | 7809 | 1783 | 1705 | 4.58/1.05/1.0 |
| S3 | 7434 | 1237 | 1313 | 5.66/0.94/1.0 |

Example 3

Combination Product

A combination product for a two-step polishing process was prepared by making a first polishing composition for the first polishing step and a second polishing composition for the second polishing step.

As the first polishing composition was used the composition S1-1 of Example 1.

The second polishing composition (S1-2) was developed to contain a lower amount of hydroxylamine, and the zirconia particles had a larger average particle size of 180 nm, but the weight percent or zirconia particles was the same (5 wt %) as for S1-1. A summary of the ingredients of the first polishing composition and second polishing composition is shown in Table 5.

TABLE 5

| | First Step S1-1 | Second Step S1-2 |
|---|---|---|
| Zirconia particles [wt %] | 5 | 5 |
| D50 size of Zirconia particles [nm] | 100 | 180 |
| Hydroxylamine [wt %] | 1.5 | 0.13 |
| Benzotriazole [wt %] | 0.01 | 0.11 |
| Glycine [wt %] | | 0.03 |
| DI Water [wt %] | Balance | Balance |
| pH (after adjustment) | 5.5 | 5.5 |

To evaluate the polishing efficiency of the second polishing composition, the same type of experiments for determining the copper removal rate, the silicon nitride removal rate and the silicon dioxide removal rate were conducted as for the composition S1-1 in Example 1. A summary of the results for the second polishing composition is shown in Table 5. It can be seen that the second polishing composition was especially efficient for polishing silicon dioxide, followed by silicon nitride, while the copper removal rate was very low.

TABLE 6

| Composition | Copper Removal Rate [Å/min] | SiN Removal Rate [Å/min] | SiO$_2$ Removal Rate [Å/min] | Selectivity Cu/SiN/SiO$_2$ |
|---|---|---|---|---|
| S1-1 | 4231 | 1415 | 1040 | 4.0/1.3/1.0 |
| S1-2 | 175 | 5435 | 7291 | 1.0/31/42 |

Example 4

Method of conducting a two-step polishing process on a patterned wafer using the combination product.

A polishing experiment is conducted by polishing a patterned wafer. The patterned wafer includes isolated copper pillars surrounded be a dielectric layer (as illustrated in FIG. 1B). The dielectric layer of the patterned wafer includes a silicon dioxide layer (made from TEOS) and a silicon nitride layer. It is aim of the polishing to remove efficiently the copper protruding parts of the copper pillars such that the remaining copper pillar sections are level with the surrounding dielectric layer while avoiding copper dishing.

The polishing compositions which are used for the first and second polishing step are summarized in Table 6 below.

TABLE 7

| | 2-step Polishing | |
|---|---|---|
| | S2-1 | S2-2 |
| Zirconia particles [wt %] | 5 | 5 |
| Hydroxylamine [wt %] | 2.5 | 0.75 |
| Benzotriazole [wt %] | 0.01 | 0.05 |
| DI Water | Balance | Balance |
| pH (after adjustment) | 5.5 | 5.5 |

It is further desired by the polishing to reduce the thickness of the outer layer of the dielectric layer (a silicon dioxide layer) by about 5000 Å.

The polishing process parameters for both polishing steps were the same as summarized in Table 3 above.

The first polishing step is conducted with a high efficiency by removing the protruding sections of the copper pillars. After conducting the second polishing step, a copper dishing value is not greater than 100 Å. Furthermore, the silicon dioxide layer is lowered in its thickness by at least 5000 Å but not more than 10,000 Å.

Example 5

Stability tests were conducted comparing slurry compositions containing zirconia particles and hydroxylamine (sample S1) with a slurry composition wherein the 1.5 wt % hydroxylamine was replaced with 1.5 wt % hydrogen peroxide (sample C5). All other ingredients of sample C5 were the same as for sample 51, including the pH.

For the stability tests, the change in the amount of oxidizing agent was measured over a time period of seven days at a temperature of 22° C. As summarized in Table 8, it was observed that the slurry composition comprising hydrogen peroxide (sample C5) already lost about 68 percent of the hydrogen peroxide amount on the first day, only a few hours after preparing the after preparing the slurry composition. In contrast, the amount of hydroxylamine of sample Si was stable over a time period of up to 7 days.

TABLE 8

|  | Day 0 | Day 2 | Day 5 | Day 7 |
| --- | --- | --- | --- | --- |
| Hydroxylamine | 1.5 wt % | 1.5 wt % | 1.5 wt % | 1.5 wt % |
| Hydrogen Peroxide | 0.48 wt % | 0.00 | 0.00 | 0.00 |

A used herein, the stability factor expresses the amount of days at 22° C. until the amount of oxidizing agent is reduced by at least 10 wt % based on the original amount of oxidizing agent in the polishing composition.

In certain embodiments, the stability factor (SF) of the polishing compositions of the present disclosure can be at least 10, at least 20, or at least 30.

The polishing compositions of the present disclosure can have the advantage of maintaining their polishing efficiency over a long time period.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of the invention.

What is claimed is:

1. A polishing composition comprising zirconia particles, an oxidizing agent including hydroxylamine and water, wherein the polishing composition is designed of polishing a copper substrate with an average material removal rate (MMR) of at least 3500 Å/min according to a copper polishing test, the copper polishing test being conducted at a downforce of 2.5 psi, a platen speed of 120 rpm, a carrier speed of 114 rpm, and a flow rate of 150 ml/min, wherein the zirconia particles include at least 98 wt % zirconia based on the total weight of the zirconia particles, and wherein a pH of the polishing composition is at least 2.5 and not greater than 5.8.

2. The polishing composition of claim 1, wherein a polishing selectivity of copper to silicon dioxide (Cu: SiO2) of the polishing composition is at least 2.5:1 and not greater than 5:1.

3. The polishing composition of claim 2, wherein the polishing selectivity of Cu: SiO2 is at least 3.5:1.

4. The polishing composition of claim 2, wherein a copper to silicon nitride (Cu: SiN) selectivity of the polishing composition is at least 2.5:1.

5. The polishing composition of claim 1, wherein the zirconia particles include at least 99.5 wt % zirconia.

6. The polishing composition of claim 1, wherein an average (D50) particle size of the zirconia particles is at least 30 nm and not greater than 500 nm.

7. The polishing composition of claim 1, wherein an amount of the hydroxylamine is at least 0.1 wt % based on the total weight of the polishing composition and not greater than 10 wt %.

8. The polishing composition of claim 1, wherein an amount of the zirconia particles is at least 1 wt % based on the total weight of the polishing composition and not greater than 10 wt %.

9. The polishing composition of claim 1, wherein the polishing composition is designed to polish the copper substrate with an average material removal rate (MMR) of at least 4000 Å/min.

10. The polishing composition of claim 1, wherein the oxidizing agent consists essentially of hydroxylamine.

11. The polishing composition of claim 1, wherein the polishing composition comprises hydroxylamine in an amount of 0.5 wt % to 3.0 wt %, the zirconia particles in an amount of 3 wt % to 8 wt %, and water in an amount of at least 90 wt % based on the total weight of the polishing composition.

12. The polishing composition of claim 1, wherein the polishing composition comprises a stability factor (SF) of at least 7.

13. A combination product comprising a first polishing composition and a second polishing composition, wherein
   the first polishing composition comprising zirconia particles and an oxidizing agent including hydroxylamine, and a pH of the first polishing composition is at least 2.5 and not greater than 5.8;
   the second polishing composition zirconia particles and an oxidizing agent including hydroxylamine, and a pH of the second polishing composition is at least 2.5 and not greater than 5.8; and
   a hydroxylamine weight % ratio of an amount of the hydroxylamine of the first polishing composition to an amount of the hydroxylamine in the second polishing composition is at least 5:1,
   wherein the first polishing composition is adapted for conducting a first polishing step and the second polishing composition is adapted for conducting a second polishing step,
   and wherein the first polishing composition has a higher polishing selectivity for copper in comparison to silica, and the second polishing composition has a higher polishing selectivity for silica in comparison to copper.

14. The combination product of claim 13, wherein an amount of the hydroxylamine of the first polishing composition is at least 1.0 wt % and not greater than 10 wt % based on the total weight of the first polishing composition; and an amount of the hydroxylamine of the second polishing composition is at least 0.05 wt % and not greater than 0.8 wt % based on the total weight of the second polishing composition.

15. The combination product of claim 13, wherein the first polishing composition and the second polishing composition include a same amount of zirconia particles, and an average particles size (D50) ratio ZP1:ZP2 of the zirconia particles of the first polishing composition (ZP1) to the zirconia particles of the second polishing composition (ZP2) is not greater than 1:1.3.

16. The combination product of claim 13, wherein the first polishing composition has a polishing selectivity of copper to silicon nitride (Cu: SiN) of at least 2.5:1, and the second polishing composition has a polishing selectivity of Cu: SiN of not greater than 1:15.

17. A method of polishing a substrate, comprising polishing the substrate with a first polishing composition, the first polishing composition being the polishing composition of claim 1.

18. The method of claim 17, wherein the substrate is a patterned wafer, the patterned wafer comprising copper pillars, a silicon nitride layer, and a silicon dioxide layer.

19. The method of claim 17, further comprising polishing the substrate with a second polishing composition after polishing the substrate with the first polishing composition, wherein the second polishing composition comprises zirconia particles and an oxidizing agent including hydroxylamine, the second polishing composition has a pH of at least 2.5 and not greater than 5.8, and a hydroxylamine weight % ratio of an amount of the hydroxylamine of the first polishing composition to an amount of the hydroxylamine in the second polishing composition is at least 5:1.

* * * * *